United States Patent [19]

Suzuki et al.

[11] Patent Number: 4,971,758
[45] Date of Patent: Nov. 20, 1990

[54] COPPER-BASED ALLOY CONNECTOR FOR ELECTRICAL DEVICES

[75] Inventors: Takeshi Suzuki; Tadao Sakakibara; Seiji Noguchi; Takao Fukatami, all of Aizuwakamatsu, Japan

[73] Assignee: Mitsubishi Shindoh Co., Ltd., Tokyo, Japan

[21] Appl. No.: 510,880

[22] Filed: Apr. 18, 1990

[30] Foreign Application Priority Data

Jul. 25, 1989 [JP] Japan ................................. 1-192189

[51] Int. Cl.⁵ .......................... C22C 9/02; C22C 9/04; H01R 9/24
[52] U.S. Cl. .................................... 420/472; 420/473; 420/476; 420/477; 420/481; 420/490; 420/499; 439/887
[58] Field of Search ............... 420/472, 473, 476, 481, 420/490, 499, 477; 439/887

[56] References Cited

U.S. PATENT DOCUMENTS 4,822,562 4/1989 Miyafuji et al. .................... 420/477

FOREIGN PATENT DOCUMENTS 3628783 10/1987 Fed. Rep. of Germany ...... 439/887

Primary Examiner—John F. Niebling
Assistant Examiner—Robert R. Koehler
Attorney, Agent, or Firm—Frishauf, Holtz, Goodman & Woodward

[57] ABSTRACT

A copper-based alloy connector excellent in electrical conductivity, adherence of solder of the connector when bent, high-temperature creep strength, and migration resistance, consists essentially by weight percent of 0.5 to 3% Ni, 0.1 to 0.9% Sn, 0.08 to 0.8% Si, 0.1 to 3% Zn, 0.007 to 0.25% Fe, 0.001 to 0.2% P, and the balance of Cu and inevitable impurities. The copper-based alloy connector can withstand use for a long term in a high-temperature and high-humidity environment.

12 Claims, 2 Drawing Sheets

10: STEPWISE-BENT TEST PIECE
A: BENDING ANGLE
D: STEP DEPTH

COPPER-BASED ALLOY CONNECTOR FOR ELECTRICAL DEVICES

BACKGROUND OF THE INVENTION

This invention relates to a copper-based alloy connector which is so excellent in electrical conductivity, adherence of solder of the connector when bent, high-temperature creep strength, and migration resistance as to withstand use in a high-temperature and high-humidity environment.

Conventionally, a copper-based alloy having a chemical composition consisting essentially by weight percent of 1.5 to 9% tin (Sn), 0.03 to 0.35% phosphorus (P), and the balance of copper (Cu) and inevitable impurities (hereinafter referred to as "phosphor bronze") has generally been used as a material for connectors for use in various electrical devices.

However, in recent years, it has been required for connectors of this kind to be smaller in size, particularly in thickness, with more complicated shapes, but to have increased electrical conductivity, in order to meet increasing demand for reduced size, increased output capacity, and increased wiring density of electrical devices.

Further, as the output capacity and hence the wiring density increase with decrease in the sizes of electrical devices, connectors often have to be arranged at short intervals, so that heat developed in the connectors is not easily dissipated, resulting in overheating of the connectors. Therefore, high-temperature strength has been required of connectors.

Furtheremore, recently, electrical devices with increased wiring density in which connectors are arranged at short intervals have been used in automotive vehicles, small-sized ships, etc. which are frequently operated in high temperature and high humidity environments where they can sometimes be splashed with water. In such high-temperature and high-humidity environments, moisture or water attached on the connectors can react with metallic elements forming the connectors to cause ionization of the metallic elements. Positive ions move to the cathode of the connector (migration), whereby metallic crystal grains grow in the structure of the connector, which sometimes results in short circuit between the connectors arranged at short intervals. The conventional connectors, which are reduced in size and complicated in shape, have short distances between the electrodes. Therefore, they cannot fully exhibit their proper functions. Further, when the connectors are used in an automotive vehicle or a small-sized ship, they are subject to vibrations and bending forces applied thereto, causing exfoliation of solder.

SUMMARY OF THE INVENTION

It is therefore the object of the invention to provide a copper-based alloy connector which is excellent in electrical conductivity, adherence of solder of the connector when bent, high-temperature creep strength, and migration resistance, while maintaining sufficient tensile strength and elongation, and spring property, thereby being able to withstand long-term use in a high-temperature and high-humidity environment.

In order to attain the above object, the present invention provides a copper-based alloy connector excellent in electrical conductivity, adherence of solder when bent, high-temperature creep strength, and migration resistance, consisting essentially by weight percent of 0.5 to 3% Ni, 0.1 to 0.9% Sn, 0.08 to 0.8% Si, 0.1 to 3% Zn, 0.007 to 0.25% Fe, 0.001 to 0.2% P, and the balance of Cu and inevitable impurities.

Preferably, the copper-based alloy connector contains by weight percent 1.3 to 2.7% Ni, 0.1 to 0.7% Sn, 0.2 to 0.8% Si, 0.2 to 1.5% Zn, 0.01 to 0.1% Fe, and 0.002 to 0.06% P.

The above and other objects, features and advantages of the invention will be more apparent from the ensuing detailed description.

DETAILED DESCRIPTION

Figure 3:
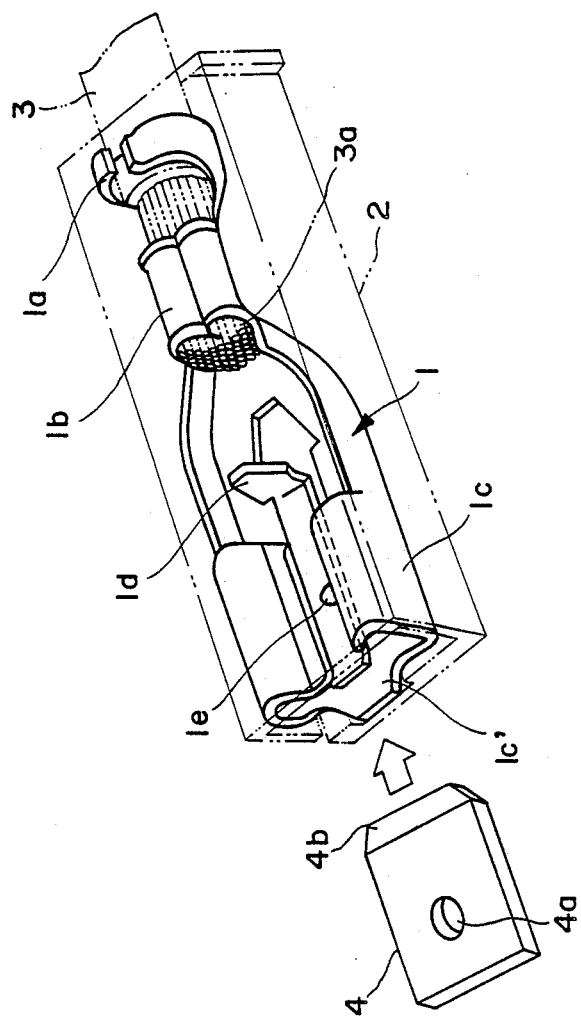
FIG. 3 is a perspective view of a copper-based alloy connector for electrical devices according to an embodiment of the invention.

Referring to FIG. 3, a connector according to the invention is illustrated by way of example. The connector has a housing 2 in which is accommodated a female terminal 1 formed of a copper-based alloy according to the invention. The female terminal I has a body of a generally dished configuration formed of a single-piece plate material of the copper-based alloy, and is composed of a retainer 1a for an electric conductor 3 provided at one end, a clamp 1b in the form of two opposed rolls for bare wires 3a of the electric conductor 3 and located adjacent the retainer 1a, a roll spring 1c in the form of two opposed inwardly bent holding wings defining a male terminal-inserting opening 1c' at an opposite end of the female terminal in cooperation with a bottom wall, a spring stopper 1d formed by an upwardly raised cut in the bottom wall, and a locking protuberance 1e formed on the bottom wall at a location intermediate between the terminal-inserting opening 1c' and the spring stopper 1d. The connector also has a male terminal 4 to be connected with the female terminal 1. The male terminal 4 is in the form of a tab or rectangular plate having a central locking hole 4a formed therein and a tapered inserting end edge 4b. An opposite end of the male terminal 4 is to be connected to a part of an electrical device, not shown. In use, the male terminal 4 has its inserting end edge 4b inserted into the opening 1c' until the inserting end edge 4b abuts against the spring stopper 1d with its central locking hole 4a fitted with the locking protuberance 1e.

Incidentally, the present invention is not limited to the connector as is stated above, but is applicable to other types of connectors which can be manufactured from a single-piece plate formed of a copper-based alloy.

Under the aforestated circumstances, the present inventors have made studies in order to obtain a copper-based alloy connector which exhibits excellent adherence of solder of the connector when an external bending force is applied thereto, excellent high-temperature creep strength when heated, and excellent migration resistance when moistened or splashed with water, while possessing satisfactory electrical conductivity, and have reached the following finding:

a connector formed of a copper-based alloy consisting essentially by weight percent of:

Ni: from 0.5 to 3 percent;
Sn: from 0.1 to 0.9 percent;
Si: from 0.08 to 0.8 percent;
Zn: from 0.1 to 3 percent
Fe: from 0.007 to 0.25 percent:
P: from 0.001 to 0.2 percent; and
Cu and inevitable impurities: the balance,
exhibits by far superiority in electrical conductivity, adherence of solder of the connector when bent, high-temperature creep strength, and migration resistance to the conventional electrical connectors, while being substantially equal to the conventional connectors in tensile strength at room temperature, elongation, and spring property (spring limit value, hereinafter defined)

Therefore, the copper-based alloy connector according to the invention has the aforesaid chemical composition.

The present invention is based upon the above finding.

The contents of the component elements of the copper-based alloy connector for electrical devices according to the invention have been limited as previously stated, for the following reasons:

(a) Nickel (Ni) and Silicon (Si):

Nickel and silicon cooperatively act to form a compound thereof which serves to greatly increase the tensile strength and the spring limit value, raise the softening point of the copper-based alloy, and increase the high-temperature creep strength, without substantially spoiling the electrical conductivity. However, if the nickel content is less than 0.5%, or if the silicon content is less than 0.08%, the compound of nickel and silicon cannot be formed in a sufficient amount, and accordingly the above action cannot be performed to a desired extent. On the other hand, if the nickel content exceeds 3%, or if the silicon content exceeds 0.8%, the copper-based alloy will have degraded hot workability and degraded electrical conductivity. Therefore, the nickel content has been limited within a range of 0.5 to 3% and preferably within a range of 1.3 to 2.7%, whereas the silicon content has been limited within a range of 0.08 to 0.8, and preferably within a range of 0.2 to 0.8%.

(b) Tin (Sn):

Tin serves to further improve the spring limit value and the bendability of the copper-based alloy. However, if the tin content is less than 0.1%, the above action cannot be performed to a desired extent. On the other band, if the tin content exceeds 0.9%, it causes degradation in the migration resistance and the electrical conductivity. Therefore, the tin content has been limited within a range of 0.1 to 0.9%, and preferably within a range of 0.1 to 0.7%.

(c) Zinc (Zn):

Zinc serves to improve the adherence of solder of the connector when bent, and the migration resistance. However, if the zinc content is less than 0.1%, the above action cannot be performed to a desired extent. On the other hand, if the zinc content exceeds 3%, the copper-based alloy connector has degraded solderability. Therefore, the zinc content has been limited within a range of 0.1 to 3%, and preferably within a range of 0.2 to 1.5%.

(d) Iron (Fe):

Iron acts to improve the hot rolling property (the effect of inhibiting occurrence of surface cracks or ear cracks in the copper-based alloy), and reduce the size of precipitated of the compound of nickel and silicon to thereby improve the adhesion strength of a plated surface of the copper-based alloy connector when heated and hence the reliability of the connector. However, if the iron content is less than 0.007%, the above action cannot be performed to a desired extent. On the other hand, if the iron content exceeds 0.25%, the hot rolling property is no longer improved, but rather degraded, and the electrical conductivity can be adversely affected. Therefore, the iron content has been limited within a range of 0.007 to 0.25%, and preferably within a range of 0.01 to 0.1%.

(e) Phosphorus (P):

Phosphorus acts to inhibit degradation in the spring limit value of the copper-based alloy connector when bent to thereby facilitate the insertion and removal of the copper-based alloy connector, and improve the migration resistance of same. However, if the phosphorus content is less than 0.001%, the above action cannot be performed to a desired extent. On the other hand, if the phosphorus content exceeds 0.2%, the copper-based alloy connector will have degraded adherence of solder of the connector when heated Therefore, the phosphorus content has been limited within a range of 0.001 to 0.2%, and more preferably within a range of 0.002 to 0.06%.

An example of the invention will now be explained hereinbelow.

EXAMPLE

Copper-based alloys having chemical compositions as shown in Table were each melted in an ordinary low-frequency channel type smelting furnace Then, the molten alloys were cast by a semicontinuous casting method to form copper-based alloy ingots each having a size of 150 mm in thickness, 400 mm in width, and 1600 mm in length. The ingots were each hot rolled at an initial hot rolling temperature within a range of 750 to 900° C. into a hot rolled plate having a thickness of 11 mm. The hot rolled plates were each water cooled and then had its opposite sides scalped by 0.5 mm, i.e. to a thickness of 10 mm, to remove cracks and scales therefrom, followed by repeatedly subjecting them to alternate cold rolling and annealing. Then, the cold rolled plates were finally annealed at a temperature within a range of 250° to 550° for 1 hour, followed by cutting the annealed plates to obtain copper-based alloy connector materials Nos. 1–9 according to the present invention.

Comparative copper-based alloy connector materials Nos. 10–18 were also manufactured in the same manner as that of the present invention, except that the content of at least one component element thereof marked with an asterisk falls out of the range of the present invention, as shown in Table. The comparative connector materials Nos. 17 and 18 were each manufactured from a molten alloy having a chemical composition falling within the range of the conventional copper-based alloy (phosphor bronze) connector.

Then, the copper-based alloy connector materials Nos. 1–9 according to the present invention and the comparative ones Nos. 10–18 were subjected to tests as to tensile strength, spring limit value, electrical conductivity, high-temperature creep strength (by determination of the stress relaxation ratio), adherence of solder of the connector when bent, adhesion strength of a plated surface when heated, and migration resistance (by measurement of the maximum leak current).

(1) Tensile Test:

Test pieces were used, which were cut out of the copper-based alloy connector materials in the direction by application of a load on the test piece. The test results are shown in Table.

TABLE

| | CHEMICAL COMPOSITION (BY WEIGHT %) | | | | | | | TENSILE STRENGTH (kgf/mm²) | ELONGA- TION (%) | BEFORE- BENDING SPRING LIMIT VALUE (kgf/mm²) |
|---|---|---|---|---|---|---|---|---|---|---|
| | Ni | Si | Sn | Zn | Fe | P | Cu AND INEVITABLE IMPURITIES | | | |
| COPPER-BASED ALLOY CONNECTOR MATERIALS ACCORDING TO THE PRESENT INVENTION | | | | | | | | | | |
| 1 | 0.54 | 0.09 | 0.80 | 2.75 | 0.008 | 0.002 | BAL. | 55.2 | 6 | 42 |
| 2 | 0.58 | 0.15 | 0.49 | 1.14 | 0.103 | 0.165 | BAL. | 56.2 | 7 | 40 |
| 3 | 1.95 | 0.54 | 0.13 | 0.18 | 0.013 | 0.190 | BAL. | 57.1 | 7 | 38 |
| 4 | 2.03 | 0.48 | 0.51 | 1.02 | 0.032 | 0.021 | BAL. | 58.8 | 8 | 44 |
| 5 | 2.07 | 0.51 | 0.65 | 1.82 | 0.240 | 0.011 | BAL. | 59.2 | 8 | 46 |
| 6 | 2.51 | 0.62 | 0.47 | 0.12 | 0.011 | 0.122 | BAL. | 60.3 | 8 | 46 |
| 7 | 2.84 | 0.73 | 0.20 | 0.95 | 0.027 | 0.031 | BAL. | 61.5 | 9 | 44 |
| 8 | 1.10 | 0.28 | 0.70 | 2.00 | 0.041 | 0.015 | BAL. | 57.2 | 9 | 46 |
| 9 | 1.50 | 0.37 | 0.65 | 1.52 | 0.118 | 0.062 | BAL. | 57.6 | 8 | 46 |
| COMPARATIVE COPPER-BASED ALLOY CONNECTOR MATERIALS | | | | | | | | | | |
| 10 | 0.38* | 0.06* | 0.32 | 1.05 | 0.035 | 0.051 | BAL. | 49.7 | 5 | 32 |
| 11 | 3.7* | 0.61 | 0.52 | 1.23 | 0.021 | 0.032 | BAL. | 61.7 | 9 | 45 |
| 12 | 2.68 | 1.0* | 0.62 | 1.59 | 0.031 | 0.020 | BAL. | 60.9 | 8 | 46 |
| 13 | 1.97 | 0.51 | 0.07* | 0.07* | 0.004* | 0.030 | BAL. | 57.8 | 5 | 34 |
| 14 | 1.95 | 0.48 | 1.18* | 0.95 | 0.045 | 0.035 | BAL. | 59.3 | 8 | 47 |
| 15 | 2.04 | 0.53 | 0.45 | 1.50 | 0.103 | 0.223* | BAL. | 58.5 | 7 | 43 |
| 16 | 2.02 | 0.52 | 0.52 | 1.03 | 0.031 | —* | BAL. | 58.2 | 8 | 44 |
| 17 | — | — | 6.23 | — | — | 0.101 | BAL. | 65.3 | 13 | 47 |
| 18 | — | — | 2.12 | — | — | 0.048 | BAL. | 55.2 | 9 | 41 |

| | AFTER- BENDING SPRING LIMIT VALUE (%) | ELECTRI- CAL CONDUC- TIVITY (IACS %) | STRESS RELAXA- TION RATIO (%) | EXFOLIA- TION OF SOLDER AT BENT PORTION | BLISTERS IN PLATED SURFACE | MAXIMUM LEAK CURRENT (A) |
|---|---|---|---|---|---|---|
| COPPER-BASED ALLOY CONNECTOR MATERIALS ACCORDING TO THE PRESENT INVENTION | | | | | | |
| 1 | 34 | 37 | 18 | ABSENT | ABSENT | 0.59 |
| 2 | 23 | 49 | 18 | ABSENT | ABSENT | 0.47 |
| 3 | 28 | 53 | 13 | ABSENT | ABSENT | 0.71 |
| 4 | 29 | 46 | 11 | ABSENT | ABSENT | 0.55 |
| 5 | 30 | 40 | 12 | ABSENT | ABSENT | 0.40 |
| 6 | 26 | 44 | 10 | ABSENT | ABSENT | 0.78 |
| 7 | 28 | 45 | 9 | ABSENT | ABSENT | 0.51 |
| 8 | 27 | 39 | 16 | ABSENT | ABSENT | 0.43 |
| 9 | 25 | 40 | 14 | ABSENT | ABSENT | 0.45 |
| COMPARATIVE COPPER-BASED ALLOY CONNECTOR MATERIALS | | | | | | |
| 10 | 27 | 49 | 27 | ABSENT | ABSENT | 0.49 |
| 11 | 28 | 31 | 9 | ABSENT | ABSENT | 0.46 |
| 12 | 29 | 32 | 10 | PRESENT | ABSENT | 0.44 |
| 13 | 57 | 53 | 14 | PRESENT | PRESENT | 1.12 |
| 14 | 25 | 30 | 13 | ABSENT | ABSENT | 0.87 |
| 15 | 26 | 45 | 11 | PRESENT | ABSENT | 0.46 |
| 16 | 45 | 44 | 12 | ABSENT | ABSENT | 0.69 |
| 17 | 26 | 15 | 28 | PRESENT | ABSENT | 2.00 |
| 18 | 27 | 30 | 32 | PRESENT | ABSENT | 1.68 |

*falls outside the range of the present invention of rolling in accordance with JIS (Japanese Industrial Standard) Test Piece No. 5, and tested as to the tensile strength and the elongation. The test results are shown in Table.

Figure 1:
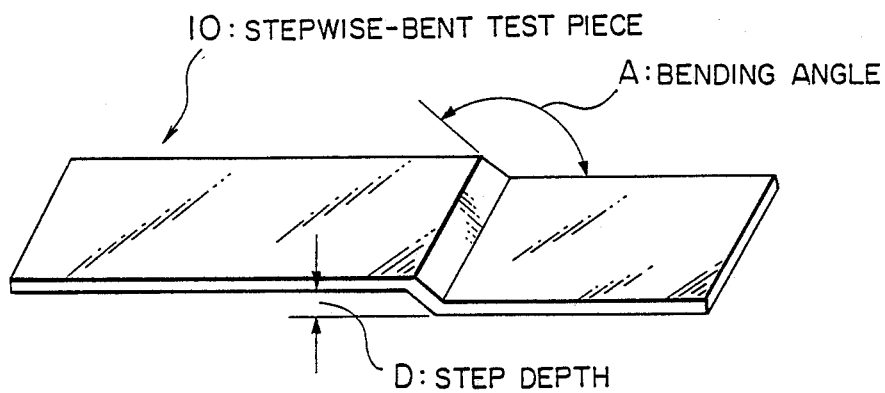
FIG. 1 is a perspective view of a stepwise-bent test piece formed of a copper-based alloy.

(2) Test as to Spring Limit Value:

Test pieces having a size of 0.25 mm in thickness, 10 mm in width, and 80 mm in length were used, which were cut out of the copper-based alloy connector materials in the direction of rolling. The test pieces were each subjected to a moment test in accordance with JIS H 3130, to measure the spring limit value (hereinafter referred to as "the before-bending limit value"). The term "spring limit value" is defined as the maximum surface stress value [kgf/mm²] assumed when the permanent deflection amount becomes 0.075 mm obtained Then, as shown in FIG. 1, test pieces having the same size as the above test pieces were each bent at a bending angle of A=130 degrees to provide a stepped portion having a step depth D=2 mm but having no radius of curvature, thus obtaining a stepwise-bent test piece. Also, the stepwise-bent test pieces were each subjected to a moment test in accordance with JIS H 3130, to measure the spring limit value (hereinafter referred to as "the after-bending limit value"). The test results are shown in Table.

In order to evaluate the degradation in spring property due to bending, the degradation rate (%) in the spring limit value was determined by substituting the before-bending spring limit value and the after-bending spring limit value into the following expression:

$$\text{Degradation rate (\%)} = \frac{\text{before-bending limit value} - \text{after-bending limit value}}{\text{before-bending limit value}} \times 100$$

The determined values of the degradation rate are shown in Table.

If a material has a large degradation rate in the spring limit value, it is not suited for use as a material for connectors, because the manufacturing process of connectors in general usually includes bending.

(3) Test as to Electrical Conductivity:

The copper-based alloy connector materials were each tested as to the electrical conductivity in accordance with JIS H 0505. The test results are shown in Table.

(4) Test as to High-Temperature Creep Strength:

Test pieces each having a size of 0.25 mm in thickness, 12.7 mm in width, and 120 mm in length ($=L_0$) were used, which were cut out of the copper-based alloy connector materials. In the test, a jig having a longitudinally elongate groove disposed horizontally was used. The test pieces were each set onto the jig such that it is upwardly curved with its opposite ends engaged by the opposite ends of the groove. The distance $L_1$ of 110 mm between the opposite ends of the set curved test piece will be referred to as $L_1$. The set test pieces were each heated at a temperature of 150° C. for 1000 hours. After each test piece was removed from the jig, the distance $L_2$ between the opposite ends of the test piece in a free state was measured. In order to evaluate the high-temperature creep strength, the stress relaxation ratio of each test piece was determined by the use of the following expression:

$$\frac{L0 - L2}{L0 - L1} \times 100 \, (\%)$$

The determined values of the stress relaxation ratio are shown in Table.

(5) Test as to Adherence of Solder of the Connector When Bent:

Test pieces each having a size of 0.25 mm in thickness, 15 mm in width, and 60 mm in length were used, which were cut out of the copper-based alloy connector materials. After being treated with a rosin flux, the test pieces were each coated with solder by dipping into a solder bath filled with molten solder of a 60% Sn-40% Pb alloy at a temperature of 230° C. After being taken out of the solder bath, the test pieces were each heated in an air atmosphere at a temperature of 150° C. for 1000 hours, and then bent by 180 degrees flat on itself and bent back by 180 degrees, in order to evaluate the adherence of solder of the copper-based alloy connector when bent. The test pieces were each examined as to absence or presence of exfoliation of solder on the bent portion. The results are shown in Table.

(6) Test as to Adhesion Strength of a Plated Surface When Heated:

Test pieces each having a size of 0.25 mm in thickness, 25 mm in width, and 100 mm in length were used, which were cut out of the copper-based alloy connector materials. The test pieces were each plated with silver to a plating layer thickness of 2 microns by an ordinary hot dipping method. The plated test pieces were each heated at a temperature of 400° C. for 3 minutes. In order to evaluate the adhesion strength of the plated surface when heated, the plated test pieces were each examined as to presence of blisters in the plated surface thereof. The results are shown in Table.

Figure 2:
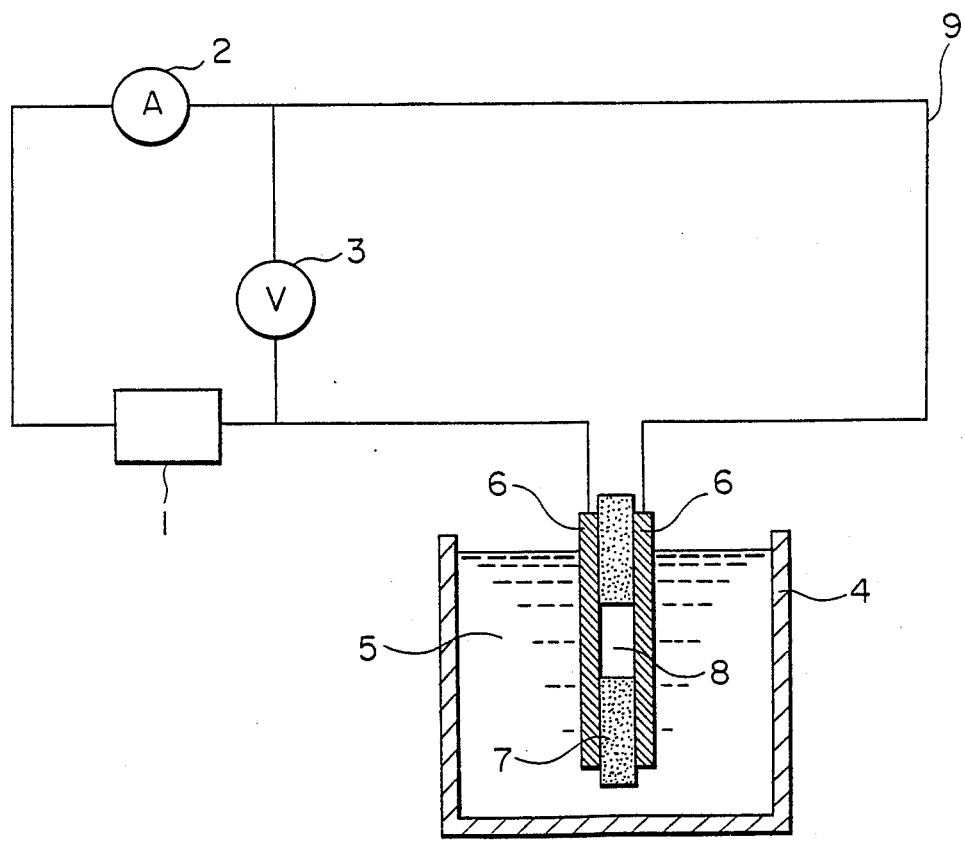
FIG. 2 is a schematic view of a device for testing migration resistance of a couple of test pieces formed of a copper-based alloy.

(7) Test as to Migration Resistance:

A couple of test pieces each having a size of 0.25 mm in thickness, 5 mm in width, and 100 mm in length were used, which were cut out of the copper-based alloy connector materials. On the other hand, as shown in FIG. 2, a testing device comprising an electric circuit was used, which is formed by a constant voltage-regulated direct-current power supply 1, an ammeter 2, a voltmeter 3, a water tank 4, city water 5 contained in the water tank 4, test pieces 6, and an insulating resin member 7 having a thickness of 1 mm and carrying the couple of test pieces 6 on opposite surfaces. The insulating resin member 7 is formed therein with a hole 8 having a diameter of 10 mm. Electric wires 9 connect one test piece 6 to a positive pole of the power supply 1 and the other test piece to a negative pole of same. The test pieces 6 carried on the insulating resin member 7 were immersed in the city water 5 within the water tank 4 for 3 minutes with a voltage of 14 V applied thereto. After being removed from the city water 5, the plated test pieces were dried for 3 minutes. The cycle of the immersion and the drying was repeated. In order to evaluate the migration resistance, measurement was made of the maximum value of leak current flowing through the test pieces 6 until 50 cycles were carried out. The results are shown in Table.

According to the results shown in Table, the copper-based alloy connector materials Nos. 1-9 according to the present invention are superior in electrical conductivity and adherence of solder to the comparative copper-based alloy connector materials Nos. 17 and 18 (which have conventional chemical compositions, i.e. phosphor bronze), while exhibiting almost the same values of tensile strength, elongation, spring limit value and adhesion strength of the plated surface (based on the presence or absence of blisters) as those of the latter. Further, as for the stress relaxation ratio and the maximum leak current, the connector materials Nos. 1-9 according to the present invention all exhibit lower values than the comparative connector materials Nos. 17 and 18, which means that the former are superior in high-temperature creep strength and migration resistance to the latter (phosphor bronze).

On the other hand, the comparative connector material No. 10, having a lower Ni content and a lower Si content than the range of the present invention, is inferior in tensile strength, before-bending spring limit value, and stress relaxation ratio to the latter. The comparative connector materials Nos. 11 and 14, each having a higher Ni content or a higher Sn content than the range of the present invention, show not satisfactorily higher electrical conductivity than that of the comparative connector materials Nos. 17 and 18 formed of conventional phosphor bronze. The comparative connector materials Nos. 12 and 15, each having a higher Si content or a higher P content than the range of the present invention, showed exfoliations of solder at bent portions thereof. When all the Sn content, the Zn content, and the Fe content are out of the range of the present invention as the comparative connector material No. 13, there occurs exfoliation of solder and blisters in the plated surface, the before-bending spring limit value greatly degrades, and the maximum leak current largely increases and accordingly the migration resistance largely degrades.

In the present invention, P is an important additive element. Specifically, if P is not contained, as in the comparative connector material No. 16, the degradation rate is after-bending spring limit value greatly decreases. Since connectors for electrical devices in general are manufactured through bending, connectors formed of connector materials having large degradation rates in spring limit value due to bending will be unable to satisfy the aforementioned severe requirements.

As described above, if the content of any of the component elements falls out of the range of the present invention (as marked with an asterisk in Table), the resulting copper-based alloy connector will show not higher electrical conductivity than the comparative copper-based connector materials Nos. 17 and 18 formed of conventional phosphor bronze or will be inferior in tensile strength and elongation, before-bending spring limit value, or stress relaxation ratio and hence high-temperature creep strength, or will suffer from exfoliation of solder when bent or blisters in the plated surface when heated, or will show increased maximum leak current and hence degradation in the migration resistance.

What is claimed is:

1. A copper-based alloy connector excellent in electrical conductivity, adherence of solder when bent, high-temperature creep strength, and migration resistance, consisting essentially by weight percent of 0.5 to 3% Ni, 0.1 to 0.8% Sn, 0.08 to 0.8% Si, 0.1 to 3% Zn, 0.007 to 0.25% Fe, 0.001 to 0.2% P, and the balance of Cu and inevitable impurities.

2. The copper-based alloy connector as claimed in claim 1, consisting essentially by weight percent 1.3 to 2.7% Ni, 0.1 to 0.7% Sn, 0.2 to 0.8% Si, 0.2 to 1.5% Zn, 0.01 to 0.1% Fe, and 0.002 to 0.06% P and the balance of Cu and inevitable impurities.

3. The copper-based alloy connector as claimed in claim 1, comprising a female terminal and a male terminal formed connectable with said female terminal, said female terminal comprising a body thereof formed of a generally dished configuration formed of a single-piece plate material of said copper-based alloy.

4. The copper-based alloy connector as claimed in claim 1, consisting essentially by weight percent of 0.54% Ni; 0.09% Si, 0.80% Sn, 2.75% Zn, 0.008% Fe, 0.002% P and the balance of Cu and inevitable impurities.

5. The copper-based alloy connector as claimed in claim 1, consisting essentially by weight percent of 0.58% Ni; 0.15% Si, 0.49% Sn, 1.4% Zn, 0.103% Fe, 0.165% P and the balance of Cu and inevitable impurities.

6. The copper based alloy connector as claimed in claim 1, consisting essentially by weight percent of 1.95% Ni, 0.54% Si, 0.13% Sn, 0.18% Zn, 0.013% Fe, 0.190% P and the balance of Cu and inevitable impurities.

7. The copper-based alloy connector as claimed in claim 1, consisting essentially by weight of 2.03% Ni, 0.48% Si, 0.51% Sn, 1.02% Zn, 0.032% Fe, 0.021% P and the balance of Cu and inevitable impurities.

8. The copper-based alloy connector as claimed in claim 1, consisting essentially by 2.07% Ni, 0.51% S, 0.65% Sn, 1.82% Zn, 0.24% Fe, 0.011% P and the balance of Cu and inevitable impurities.

9. The copper-based alloy connector as claimed in claim 4, consisting essentially by weight percent of 2.51% Ni, 0.62% Si, 0.47% Sn, 0.12% Zn, 0.011% Fe, 0.122% P and the balance of Cu and inevitable impurities.

10. The copper-based alloy connector as claimed in claim 4, consisting essentially by weight percent of 2.84% Ni, 0.73% Si, 0.20% Sn, 0.95% Zn, 0.027% Fe, 0.031% P and the balance of Cu and inevitable impurities.

11. The copper-based alloy connector as claimed in claim 4, consisting essentially by weight percent of 1.1% Ni, 0.28% Si, 0.7% Sn, 2% Zn, 0.041% Fe, 0.015% P and the balance of Cu and inevitable impurities.

12. The copper-based alloy connector as claimed in claim 4, consisting essentially by weight percent of 1.5% Ni, 0.37% Si, 0.65% Sn, 1.52% Zn, 0.118% Fe, 0.062% P and the balance of Cu and inevitable impurities.

* * * * *

UNITED STATES PATENT AND TRADEMARK OFFICE
CERTIFICATE OF CORRECTION

PATENT NO. : 4,971,758

DATED : November 20, 1990

INVENTOR(S) : SUZUKI et al

It is certified that error appears in the above-identified patent and that said Letters Patent is hereby corrected as shown below:

Column 9, Claim 1, line 5 -

Change: "to 0.8%" (first occurrence) to --to 0.9%--.

Signed and Sealed this

Eighth Day of September, 1992

Attest:

DOUGLAS B. COMER

*Attesting Officer*     *Acting Commissioner of Patents and Trademarks*